US 6,534,917 B1

United States Patent
Kira

(10) Patent No.: US 6,534,917 B1
(45) Date of Patent: Mar. 18, 2003

(54) MERCURY-FILLED DISCHARGE LAMP WITH STABILIZED LIGHT INTENSITY

(75) Inventor: Takehiro Kira, Kobe (JP)

(73) Assignee: Ysguidebju Jabysguju Jausga, Tokyo (JP)

( * ) Notice: Subject to any disclaimer, the term of this patent is extended or adjusted under 35 U.S.C. 154(b) by 106 days.

(21) Appl. No.: 09/763,606

(22) PCT Filed: Jun. 26, 2000

(86) PCT No.: PCT/JP00/04175

§ 371 (c)(1),
(2), (4) Date: Feb. 28, 2001

(87) PCT Pub. No.: WO01/01447

PCT Pub. Date: Jan. 4, 2001

(30) Foreign Application Priority Data

Jun. 29, 1999 (JP) .......................... 11-183929

(51) Int. Cl.[7] .......................... H01J 17/18; H01J 61/36
(52) U.S. Cl. ........................ 313/623; 313/625
(58) Field of Search ................. 313/623, 625, 313/631, 632, 634, 493

(56) References Cited

U.S. PATENT DOCUMENTS

| | | | |
|---|---|---|---|
| 3,422,300 A | * | 1/1969 | Knochel et al. ............ 313/626 |
| 5,140,222 A | | 8/1992 | Roznerski |
| 5,369,329 A | * | 11/1994 | Austad et al. ............ 313/623 X |
| 5,569,978 A | * | 10/1996 | Oiye et al. .................... 313/631 |
| 5,598,063 A | * | 1/1997 | Mathews et al. ............ 313/623 |
| 5,859,492 A | * | 1/1999 | Austad et al. ............ 313/623 X |
| 6,356,018 B1 | * | 3/2002 | Higashimoto et al. ...... 313/623 |
| 6,369,509 B1 | * | 4/2002 | Ookubo et al. ............. 313/623 |
| 6,375,533 B1 | * | 4/2002 | Torikai et al. ............ 313/625 X |

FOREIGN PATENT DOCUMENTS

JP 4-249060 A 9/1992
JP 11-144686 A 5/1999

* cited by examiner

*Primary Examiner*—William J. Royer
(74) *Attorney, Agent, or Firm*—Nixon Peabody LLP; David S. Safran

(57) ABSTRACT

A discharge lamp including a bulb hermetically filled with mercury and an anode and cathode facing each other within the light emitting space of the bulb. A thermal conductor plate is arranged at the end of the cathode where it contacts the electrode rod bearing the cathode. The anode is positioned above the cathode and almost all the mercury in the light emitting space of the bulb is condensed on the thermal conductor plate in the light emitting space when the discharge lamp is not lit. When the discharge lamp is lit, the heat generated at the cathode is transmitted to the thermal conductor plate through electrode rods. Simultaneously, the radiated heat is discharged from within the arc so that the mercury condensed on the thermal conductor plate is evaporated early resulting in the stabilization of the light emitting intensity of the radiated light within a short period of time.

5 Claims, 3 Drawing Sheets

MERCURY-FILLED DISCHARGE LAMP WITH STABILIZED LIGHT INTENSITY

BACKGROUND OF THE INVENTION

1. Field of the Invention

The present invention relates to a discharge lamp that is preferably used as a light source for exposure in the manufacture of a liquid crystal display element, a color filter, a printed circuit board or a semiconductor element.

2. Description of the Related Art

In the case of a manufacturing process of a liquid crystal display element, a color filter, a printed circuit board and a semiconductor element and the like, a photolithography process is utilized for performing exposure of micro-images, and a short-arc type discharge lamp is used as a light source for exposure. Such a short-arc type discharge lamp is made such that there is provided a bulb having bulb-sealing sections jointly connected to both ends of a light emitting tube which encloses a light emitting space, and both an anode and a cathode are arranged opposite to each other within the light emitting tube of this bulb, and both inert gas and mercury or the like, for example, are hermetically filled therein.

In FIG. 3, a practical example of a conventional short-arc type discharge lamp will be described as follows, wherein a bulb 50 of the discharge lamp is made such that outward extending cylindrical sealing tubes 52 are jointly arranged at both ends of an elliptical spherical light emitting tube 51 enclosing a light emitting space S, and narrowed sections 52a provided such that the diameter of the formed sealing tube 52 is reduced at locations near the light emitting tube 51 of the sealing tubes 52 following the light emitting tube 51.

Within the light emitting tube 51 an anode 53 and a cathode 54 are arranged opposite, each of these electrodes is fixed to and supported by an electrode rod 55 extending from the sealing tube 52 to the light emitting tube 51 along an axis of the bulb. Within the sealing tubes 52 are arranged electrode rod holding cylinders 56 having cylindrical holes adapted to the outer diameters of the electrode rods 55 in a state in which the base ends of the electrode rods 55 are inserted therein, the outer circumferential surface of the electrode rod holding cylinder 56 adheres and is hermetically sealed to the inner surface of the narrowed section 52a. Each of sealing glass members 57 is comprised of an inner frustro-conical end 57a, the diameter of which is enlarged in the direction of the outer end, and a cylindrical barrel 57b following the inner end is arranged at an outer end of the electrode rod holding cylinder 56. The sealing glass member 57 is formed with a hole 57c having a bottom part extending from its outer end surface along an axial direction, and an outer lead rod 58 having an outer diameter adapted to its inner diameter is inserted into the hole 57c having the bottom part.

A plurality of belt-like metallic foils 60 are spaced apart from each other in a circumferential direction of the sealing glass member 57 and arranged at the outer circumferential surface of the sealing glass member 57 so as to extend from the inner end to the outer end of the sealing glass member 57, the inner end of each of the metallic foils 60 extends along the inner end surface of the sealing glass member 57 and is connected to the electrode rod 55, an outer end of each of the metallic foils 60 extends along the outer end surface of the sealing glass member 57 and is connected to the outer lead rod 58. In addition, the outer circumferential surface of the sealing glass member 57 adheres and is hermetically sealed to the inner surface of the sealing tube 52 through the metallic foils 60. At an outer end of the sealing glass member 57 is arranged a lead rod holding cylinder 59 having a cylindrical hole adapted to an outer diameter of the outer lead rod 58 in a state in which the outer lead rod 58 is being inserted, and the outer circumferential surface of the lead rod holding cylinder 59 adheres and is hermetically fixed to the inner surface of the sealing tube 52.

Such a discharge lamp as described above is normally lit in a vertical lighting process, i.e., the anode 53 and the cathode 54 are facing oppositely in a vertical direction in order to maintain a stable state of the arc formed between the anode 53 and the cathode 54 during lighting of the discharge lamp. However, in the case in which the discharge lamp is lit in such a way that the cathode 54 is positioned above the anode 53 in such a vertical lighting system, the direction in which mercury vapor flows from convection between the anode 53 and the cathode 54, and the direction in which thermo-ionic electrons discharged from the cathode 54 move towards the anode 53 are opposite from each other so that the motion of the thermo-ionic electrons is influenced by the convection of the mercury vapor with the result that there is a possibility of arc fluctuation.

Furthermore, in the case in which the discharge lamp is lit such that the anode 53 is positioned above the cathode 54, the direction in which the mercury vapor flows in a convection between the anode 53 and the cathode 54 and the direction in which the thermo-ionic electrons discharged from the cathode 54 move toward the anode 53 are made to be the same so that the motion of the thermo-ionic electrons is not influenced by the convection of the mercury vapor with the result that the state of the arc can be kept in a more stable condition. However, in the case in which the discharge lamp is lit such that the anode 53 is positioned above the cathode 54, there occurs numerous problems. For example, in a state in which the discharge lamp is not lit, almost all of the mercury hermetically filled within the light emitting space S of the bulb 50 is present in a state in which the mercury is condensed at the end part of the cathode 54 in the light emitting space S (on the inner end surface of the electrode rod holding cylinder 56). Then, when the discharge lamp is lit in such a state, since the temperature of heat generated at the cathode 54 is substantially low as compared with the temperature of heat generated at the anode 53, it is not possible to evaporate the mercury condensed at the end part of the cathode 54 in the light emitting space S within a short period of time after starting lighting of the discharge lamp resulting in that it requires a rather long period of time until the light emitting intensity of the radiated light becomes stable.

In particular, in recent years it has been required to provide a discharge lamp having a high light emitting intensity of radiation light, and in correspondence with this requirement there is a tendency that the amount of mercury filled in the bulb 50 is increased. Although in the case that such a discharge lamp is lit such that the anode 53 is positioned above the cathode 54 it becomes hard to completely evaporate the encapsulated mercury resulting in that radiated light having a desired light emitting intensity cannot be attained.

SUMMARY OF THE INVENTION

The present invention has been made with respect to the aforesaid circumstances, and it is an object of the present invention to provide a discharge lamp in which the state of the arc can be stably maintained and the light emitting intensity of the radiated light can be stabilized within a short period of time after starting the lighting operation.

The discharge lamp of the present invention includes a bulb having a light emitting tube enclosing a light emitting space and sealing tube sections arranged at both ends of the light emitting tube; an anode and a cathode oppositely arranged to face each other within the light emitting space of the bulb; and electrode rods bearing the anode and, respectively, cathode at their extreme ends extending from the sealing tube sections of the bulb toward the light emitting tube, and mercury being hermetically filled in the light emitting space of the bulb, characterized in that a thermal conductor plate is arranged at the end part of the cathode in the light emitting space of the bulb in a state in which it is being contacted with the electrode rod bearing the cathode.

In the case of the discharge lamp of the present invention, the electrode rod holding cylinder with its end surface being exposed to the light emitting space is arranged at a position of the bulb near the light emitting tube in the sealing tubes in a way in which the outer circumferential surface is adhered and sealed to the inner circumferential surface of the sealing tube, and the electrode rod bearing the cathode is inserted in the cylinder hole formed in the electrode rod holding cylinder, the thermal conductor plate is a disc having a hole of an inner diameter adapted to an outer diameter of the electrode rod in its central part and it has a smaller outer diameter than the outer diameter of the electrode rod holding cylinder, and it is preferable that the thermal conductor plate is arranged at one end surface exposed to the light emitting space in the electrode rod holding cylinder in a way such that the electrode rod is being fitted into the hole of the thermal conductor plate. In addition, in the case of the discharge lamp of the present invention, it is preferable that the discharge lamp is lit in a way such that the anode is positioned above the cathode.

If the discharge lamp having the aforesaid configuration is arranged in such a way that the anode is positioned above the cathode, almost all of the mercury filled in the light emitting space of the bulb is present such that the mercury is condensed on the thermal conductor plate arranged at the end part of the cathode in the light emitting space in a condition in which the discharge lamp is not lit. Thus, when the discharge lamp is lit in such a condition as described above, the heat generated at the cathode is transmitted to the thermal conductor plate through the electrode rods, and at the same time the thermal conductor plate is heated upon reception of the radiated heat (in particular, infrared rays) discharged from within the arc so that the mercury condensed on the thermal conductor plate is evaporated early resulting in that the light emitting intensity of the radiated light can be stabilized within a short period of time after starting the lighting of the lamp.

DETAILED DESCRIPTION OF THE PREFERRED EMBODIMENT

Figure 1:
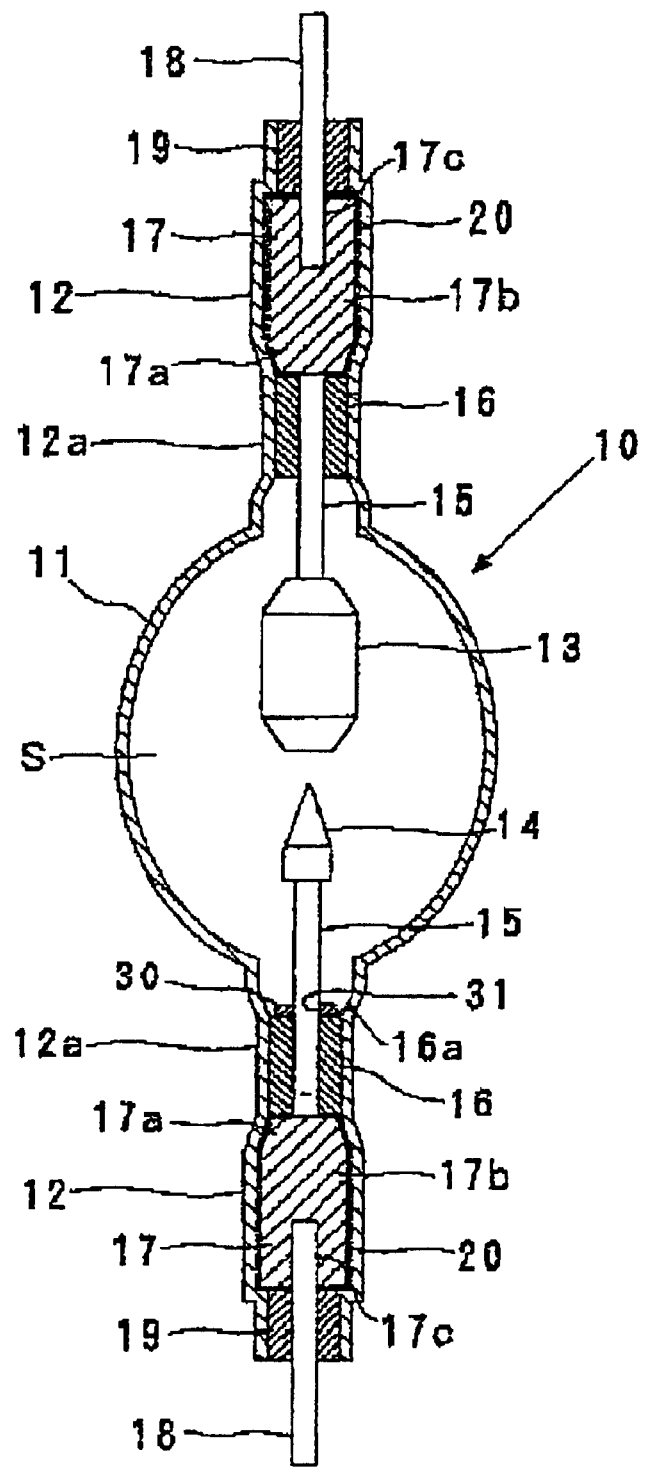
FIG. 1 is a sectional view showing the construction of a short-arc type discharge lamp in accordance with the present invention.

And now to the drawings, in which FIG. 1 shows in a sectional view the construction of a short-arc type discharge lamp including a bulb 10 preferably made of quartz glass and constituted by an elliptical spherical light emitting tube 11 enclosing a light emitting space S, and cylindrical sealing tubes 12 jointly arranged extending outwardly from both ends of the light emitting tube 11. Locations near the light emitting tube 11 of the sealing tubes 12 subsequent to the light emitting tube 11 are provided with narrowed sections 12a in a way such that the diameter of a part of the sealing tube 12 is reduced. Within the light emitting tube 11 of the bulb 10 there is arranged an anode 13 and a cathode 14 preferably made of tungsten in such a way that they oppositely face each other, wherein the anode 13 as well as the cathode 14 are fixed to and supported by the extreme ends of column-like electrode rods 15 preferably made of tungsten, extending from the sealing tube 12 toward the light emitting tube 11 along an axis of the bulb 10.

Within the light emitting tube 11 of the bulb 10 are hermetically filled inert gases such as xenon, argon, krypton and the like, or filled gas composed of mixtures of these and a light emitting substance such as mercury or the like. At the time of filling, the pressure of the enclosed gas is 0.1 to 10 atm, and the amount of the filled mercury is 10 to 60 mg/cc by weight per inner volume of the light emitting space S in the bulb 10. Electrode rod holding cylinders 16 preferably made of quartz glass having cylindrical holes of an inner diameter adapted to the outer diameter of the electrode rods 15 are arranged at locations near the light emitting tube 11 within the sealing tubes 12 of the bulb 10 in a way such that the electrode rods 15 are inserted, the outer circumferential surface of each of the electrode rod holding cylinders 16 is adhered and hermetically sealed to the inner surface of the narrowed section 12a which is a part of the sealing tube 12, and one end surface 16a of the electrode rod holding cylinder 16 is exposed to the light emitting space S.

At the outer ends of the electrode rod holding cylinders 16 within the sealing tubes 12 are arranged sealing glass members 17, respectively. In the sealing glass members 17, the inner ends 17a at the light emitting space S are formed as a frustum of a cone as their diameters increase toward the outer ends. Following the inner ends 17a, cylindrical barrels 17b having an outer diameter adapted to the inner diameter of the sealing tube 12 are formed. In addition, the sealing glass member 17 is provided with a hole 17c having a bottom part extending from its outer end surface along the axial direction, and an outer lead rod 18 with an outer diameter adapted to the inner diameter of the hole 17c having the bottom part is inserted into the hole 17c.

A plurality of belt-like metallic foils 20 preferably made of molybdenum are arranged on an outer circumferential surface of the sealing glass member 17 in such a way that the foils are spaced apart in a circumferential direction of the sealing glass member 17 so as to extend from the inner end of the sealing glass member 17 toward its outer end, wherein each of the inner ends of the metallic foil 20 extends along the inner end surface of the sealing glass member 17 and is connected to the electrode rod 15, and each of the outer ends of the metallic foil 20 extends along the outer end surface of the sealing glass member 17 and is connected to the outer lead rod 18. In addition, the outer circumferential surface of the sealing glass member 17 is adhered and hermetically sealed to the inner surface of the sealing tube 12 through the metallic foils 20. A lead rod holding cylinder 19 made of quartz glass having a cylindrical hole adapted to the outer diameter of the outer lead rod 18 is arranged at the outer end of the sealing glass member 17 such that the electrode rod 15 is inserted into it, and the outer circumferential surface of the lead rod holding cylinder 19 is adhered and hermetically sealed to the inner surface of the sealing tube 12.

Figure 2:
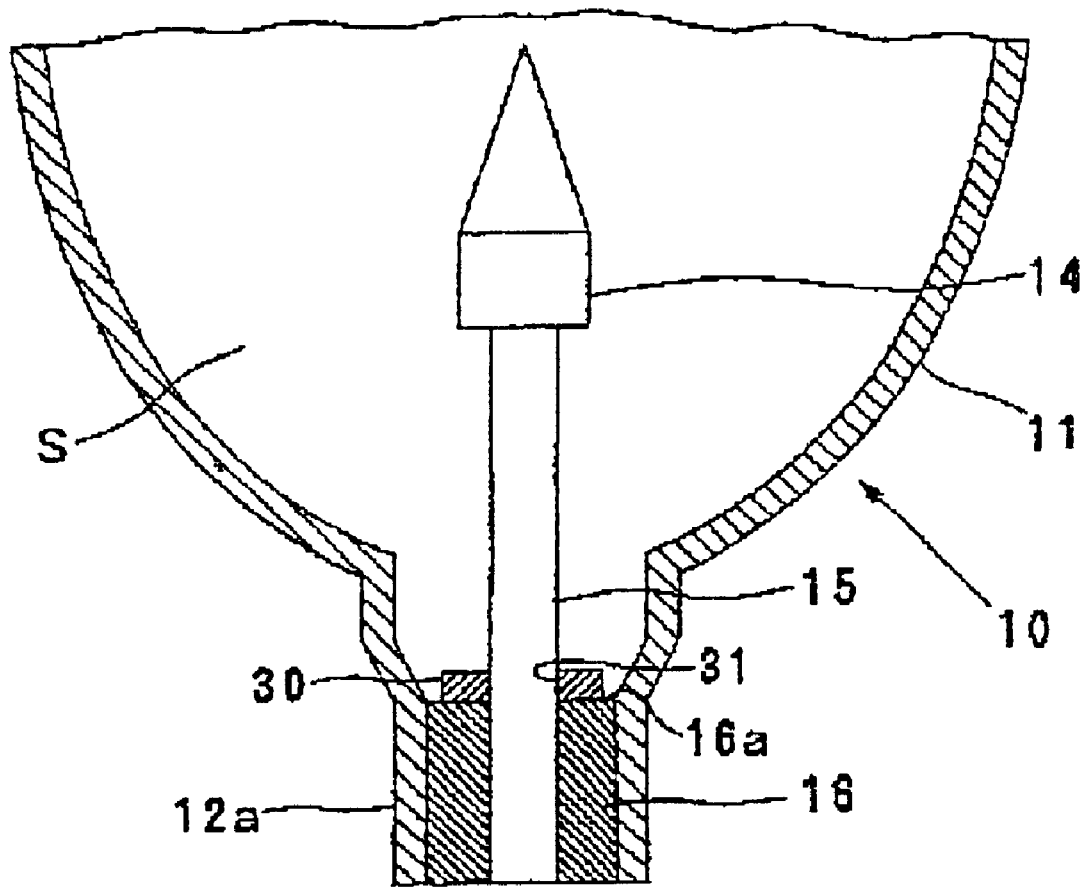
FIG. 2 is a sectional view showing an enlarged main part of the discharge lamp shown in FIG. 1.
Figure 3:
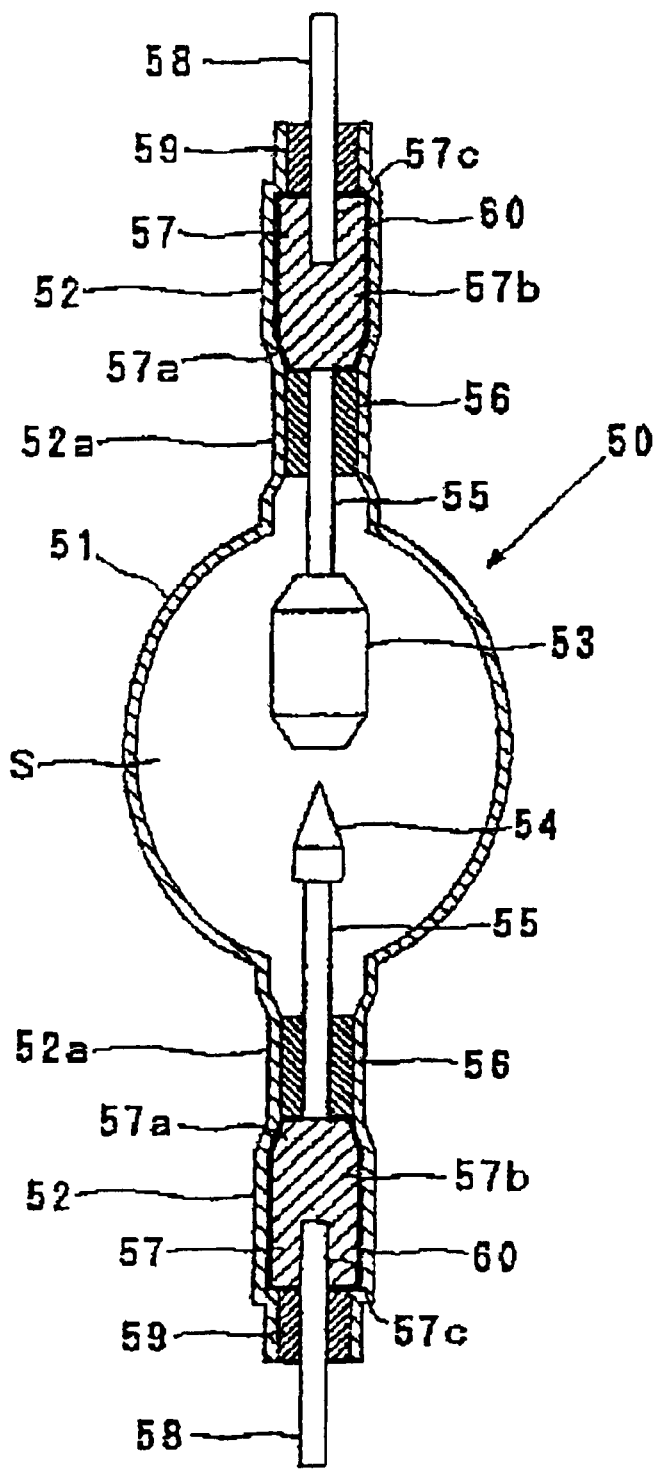
FIG. 3 is a sectional view showing the construction of a prior art short-arc type discharge lamp.

As shown in FIG. 2, a disc-like thermal conductor plate 30 having a hole 31 with an inner diameter adapted to the outer diameter of the electrode rod 15 is arranged on the end part of the cathode 14 within the light emitting space S of the bulb 10, i.e., one end surface 16a is exposed to the light emitting space S on the electrode rod holding cylinder 16 for holding the electrode rod 15 supporting the cathode 14 in a way such that the electrode rod 15 is inserted into the hole 31 of the thermal conductor plate 30. More practically, the thermal conductor plate 30 is fixed while being contacted with the electrode rod 15 by fitting the electrode rod 15 into the hole 31. This thermal conductor plate 30 has a smaller outer diameter than an outer diameter of the electrode rod holding cylinder 16 and accordingly the outer circumferential surface of the thermal conductor plate 30 is not contacted with the bulb 10. As the material constituting the thermal conductor plate 30, it is preferable that metal is applied. As metal constituting the thermal conductor plate 30, it is preferable that a high melting point metal having a high thermal conductivity is applied, and further as a practical example, it is possible to use molybdenum, tantalum and stainless steel and the like.

In the aforementioned discharge lamp, when the anode 13 is arranged in a way such that the anode 13 is positioned above the cathode 14, almost all of the mercury filled in the light emitting space S of the bulb 10 is present, in a condensed state, at the end part of the cathode 14 in the light emitting space S, more practically on the thermal conductor plate 30 arranged on one end surface 16a exposed to the light emitting space S at the electrode rod holding cylinder 16 for holding the electrode rod 15 where the cathode 14 is supported in a state in which the discharge lamp is not lit. Thus, when the discharge lamp is lit in such a state as above, heat generated at the cathode 14 is transmitted to the thermal conductor plate 30 through the electrode rod 15 and, at the same time, the thermal conductor plate 30 is heated by receiving radiated light (in particular, infrared rays) from the arc, whereby the mercury condensed on the thermal conductor plate 30 is evaporated fast resulting in that the light emitting intensity of the radiation light can be stabilized within a short period of time after starting the turning-on of the lamp.

Additionally, the thermal conductor plate 30 is constituted by metal and the thermal conductor plate 30 has a function to reflect the light so that the radiated light (in particular, infrared rays) from the arc is reflected by the thermal conductor plate 30, the reflection light (in particular, infrared rays) is radiated onto the mercury condensed at locations other than the thermal conductor plate 30 resulting in that the mercury can be advantageously evaporated. In addition, since the thermal conductor plate 30 has a smaller outer diameter than the outer diameter of the electrode rod holding cylinder 16 and so the thermal conductor plate 30 is in contact with the bulb 10 it is possible to avoid damage of the bulb 10 by the thermal conductor plate 30.

Next, the lamp is lit in a way such that the anode 13 is positioned above the cathode 14, whereby the direction in which the mercury vapor underlies a convection flow between the anode 13 and the cathode 14 and the direction in which the thermo-ionic electrons discharged from the cathode 14 moves to the anode 13 become the same so that the motion of the thermo-ionic electrons is not influenced by the convection of the mercury vapor resulting in that the state of the arc formed between the anode 13 and the cathode 14 can be kept stable.

It is possible that various kinds of modifications can be applied to the discharge lamp of the present invention without being limited to the aforesaid embodiment. For example, the practical shape and structure of the bulb 10 (the light emitting tube 11 and the sealing tube sections 12) are not restricted to those shown in FIG. 1, but various kinds of configuration can be employed. Although the practical example of the discharge lamp of the present invention will be described as follows, the present invention is not limited to this example.

With reference to the configuration shown in FIG. 1, the present inventor manufactured ten pieces of the short-arc type discharge lamps of the present invention.

Bulb 10: made of quartz glass; full length of 89 mm; maximum outer diameter of the light emitting bulb 11 of 80 mm (wall thickness of 3 mm), outer diameter of the sealing tube section 12 of 20 mm (wall thickness of 7 mm), volume of light emitting space S of 215 cm$^3$;

Anode 13: made of tungsten; maximum outer diameter of 25 mm; full length of 45 mm;

Cathode 14: made of tungsten; maximum outer diameter of 10 mm; full length of 18 mm;

Electrode rod 15: made of tungsten; outer diameter of 6 mm; full length of 51 mm;

Electrode rod holding cylinder 16: made of quartz glass; outer diameter of 13 mm, inner diameter of 6.5 mm; full length of 18 mm;

Sealing glass member 17: made of quartz glass, outer diameter of the barrel section 17b of 23 mm; full length of 12 mm;

Outer lead rod 18: made of tungsten; outer diameter of 6 mm; full length of 37 mm;

Lead rod holding cylinder 19: made of quartz glass; outer diameter of 18 mm; inner diameter of 6.5 mm; full length of 12 mm;

Metallic foil 20: made of molybdenum; thickness of 0.04 mm; number of foils of 5 pc;

Thermal conductor plate 30: made of molybdenum; outer diameter of 10 mm; thickness of 0.5 mm; inner diameter of the hole 31 of 6.1 mm;

Distance between the anode 13 and the cathode 14: 7.5 mm;

Filled substances: xenon gas (pressure at the time of filling of 1 atm), mercury of 2.7 g;

Rated voltage: 50 V;

Rated current: 100A;

Rated power: 5 kW;

Next, each of the aforesaid discharge lamps was lit and a time ranging from after activation to reaching 90% of the maximum light emitting intensity was measured to attain 5 to 6 minutes, respectively. It was confirmed that the light emitting intensity was stabilized within a short period of time. In a first example, a total number of 20 pieces of short-arc type discharge lamps were made in the same way as that of the first embodiment except that no thermal conductor plate was used, each of the discharge lamps was lit, the time ranging after activation to reaching 90% of the maximum light emitting intensity was measured to attain 10 minutes or more, respectively.

In accordance with the discharge lamp of the present invention, since the thermal conductor plate 30 is installed at the end section of the cathode 14 within the light emitting space of the bulb 11 while being contacted with the electrode rod 15, heat generated at the cathode 14 is transmitted to the thermal conductor plate 30 through the electrode rod 15, and at the same time, the thermal conductor plate 30 is heated by receiving the radiation light (in particular, infrared rays) from within the arc whereby mercury condensed on the thermal conductor plate 30 is evaporated fast resulting in that it is possible to stabilize the light emitting intensity of the radiated light within a short period of time after starting the turning-on operation of the lamp.

Furthermore, according to the configuration in which, as the thermal conductor plate 30, a disc plate with a smaller outer diameter than that of the electrode rod holding cylinder 16 having a hole 31 at the center thereof is applied and the thermal conductor plate 30 is arranged at one end surface exposed to the light emitting space S in the electrode rod holding cylinder 16 set in the sealing tube section of the bulb 11 such that the electrode rod 15 is inserted into the hole 31 of the thermal conductor plate 30. Accordingly, it is possible to prevent the bulb from being damaged by the thermal conductor plate 30 due to the fact that the thermal conductor plate 30 is not in contact with the bulb 11.

Next, since such a discharge lamp as described above is lit in a way where the anode 13 is positioned above the cathode 14, the direction in which the mercury vapor shows a convection flow between the anode 13 and the cathode 14, and the direction in which the thermo-ionic electrons discharged out of the cathode 14 move toward the anode 13 are made to be same so that the motion of the thermo-ionic electrons is not influenced by the convection of the mercury vapor resulting in that it is possible to maintain a stable state of the arc formed between the anode 13 and the cathode 14.

What is claimed is:

1. A discharge lamp comprising:

a bulb including a light emitting tube configured so as to enclose a light emitting space and having a sealing tube section arranged at each of opposite ends of said light emitting tube;

first and second electrode rods extending from a respective sealing tube section of said bulb towards said light emitting tube; and an anode and a cathode attached at a distal end of a respective one of said first and second electrode rods so as to oppositely face each other within said light emitting space of said bulb, wherein said light emitting space of said bulb is hermetically filled with mercury, wherein a thermal conductor plate is arranged proximate said cathode and within said light emitting space of said bulb in such a way as to contact said second electrode rod.

2. The discharge lamp according to claim 1, comprising first and second electrode rod holding cylinders having respective end surfaces exposed to said light emitting space and being arranged proximate said light emitting tube in said respective sealing tube section of said bulb such that an outer circumferential surface of the said first and second electrode rod holding cylinders adheres and is sealed to an inner circumferential surface of the respective sealing tube section and such that said first and second electrode rods are received into a cylindrical hole formed in said first and second electrode rod holding cylinders, respectively.

3. The discharge lamp according to claim 2, wherein said thermal conductor plate is a disc having a centrally disposed hole for receiving said second electrode rod and having an outer diameter that is smaller than an outer diameter of said electrode rod holding cylinder.

4. The discharge lamp according to claim 3, wherein said thermal conductor plate is arranged at the end surface exposed to the light emitting space of one of said electrode rod holding cylinders in a way such that said second electrode rod is inserted into the hole of said thermal conductor plate.

5. The discharge lamp according to claim 4, wherein said anode is positioned above said cathode such that, when said discharge lamp is lit, heat generated by said cathode is transmitted to said thermal conductor plate through said second electrode rod, and at the same time, said thermal conductor plate is heated upon reception of the radiated heat discharged so that at least a portion of the mercury condensed on said thermal conductor plate is evaporated, thereby resulting in a light emitting intensity of radiated light being stabilized within a short period of time subsequent to said discharge lamp being lit.

* * * * *

UNITED STATES PATENT AND TRADEMARK OFFICE
CERTIFICATE OF CORRECTION

PATENT NO. : 6,534,917 B1 Page 1 of 1
DATED : March 18, 2003
INVENTOR(S) : Takehiro Kira It is certified that error appears in the above-identified patent and that said Letters Patent is hereby corrected as shown below:

<u>Title page,</u>
Item [73], Assignee, should read as follows: -- Ushiodenki Kabushiki Kaisha, Tokyo, (JP) --

Signed and Sealed this

Twenty-first Day of October, 2003

JAMES E. ROGAN
*Director of the United States Patent and Trademark Office*